United States Patent
Bae et al.

(10) Patent No.: US 12,327,713 B2
(45) Date of Patent: *Jun. 10, 2025

(54) PLASMA REACTOR FOR INDUCTIVELY COUPLED PLASMA AND METHOD OF ASSEMBLING THE SAME

(71) Applicants: LOT CES CO., LTD., Osan-si (KR); LOT VACUUM CO., LTD., Osan-si (KR)

(72) Inventors: Jin Ho Bae, Hwaseong-si (KR); Min Jae Kim, Ansan-si (KR); Geon Bo Sim, Osan-si (KR); Tae Wook Yoo, Seoul (KR)

(73) Assignees: LOT CES CO., LTD., Osan-si (KR); LOT VACUUM CO., LTD., Osan-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 18/766,571

(22) Filed: Jul. 8, 2024

(65) Prior Publication Data
US 2024/0363316 A1  Oct. 31, 2024

Related U.S. Application Data

(63) Continuation of application No. 17/918,103, filed as application No. PCT/KR2021/005044 on Apr. 21, 2021, now Pat. No. 12,062,528.

(30) Foreign Application Priority Data

May 15, 2020 (KR) .................. 10-2020-0058137

(51) Int. Cl.
*H01J 37/32* (2006.01)
(52) U.S. Cl.
CPC ...... *H01J 37/32844* (2013.01); *H01J 37/321* (2013.01); *H01J 37/32807* (2013.01)

(58) Field of Classification Search
CPC .... H01J 37/32; H01J 37/32844; H01J 37/321; H05H 1/24
See application file for complete search history.

(56) References Cited

U.S. PATENT DOCUMENTS

2015/0196873 A1  7/2015  Hong et al.
2023/0377842 A1  11/2023 Bae et al.

FOREIGN PATENT DOCUMENTS

KR       10-1448449 B1    10/2014
KR    10-2015-0057663 A    5/2015
(Continued)

OTHER PUBLICATIONS

International Search Report for PCT/KR2021/005044 mailed Aug. 23, 2021 from Korean Intellectual Property Office.

*Primary Examiner* — Monica C King
(74) *Attorney, Agent, or Firm* — Revolution IP, PLLC

(57) ABSTRACT

A plasma reactor for inductively coupled plasma includes: a ferrite core assembly including a ferrite core stacked body including a plurality of ferrite cores stacked and a first passage portion and a second passage portion arranged in parallel, and a ferrite core accommodating structure; a first chamber body including a first base portion configured to provide a first internal space therein, a first A-extension pipe extending from the first base portion, communicating with the first internal space and accommodated in the first passage portion, and a second A-extension pipe extending from the first base portion; and a second chamber body including a second base portion configured to provide a second internal space therein, a first B-extension pipe extending from the second base portion, and a second B-extension pipe extending from the second base portion.

10 Claims, 4 Drawing Sheets

(56) References Cited

FOREIGN PATENT DOCUMENTS

| | | | |
|---|---|---|---|
| KR | 10-2017-0028289 | A | 3/2017 |
| KR | 10-2017-0050616 | A | 5/2017 |
| KR | 10-2018-0001799 | A | 1/2018 |
| KR | 10-2019-0019651 | A | 2/2019 |

PLASMA REACTOR FOR INDUCTIVELY COUPLED PLASMA AND METHOD OF ASSEMBLING THE SAME

CROSS-REFERENCE TO RELATED PATENT APPLICATIONS

This application is a continuation application of U.S. patent application Ser. No. 17/918,103 filed on Oct. 10, 2022, which under 35 U.S.C. § 120, which is the 35 U.S.C. § 371 national stage of PCT International Patent Application No. PCT/KR2021/005044 filed on Apr. 21, 2021, under 35 U.S.C. § 371, which claims priority to Korean Patent Application No. 10-2020-0058137 filed on May 15, 2020 which is hereby incorporated by reference in its entirety.

BACKGROUND

Technical Field

The present invention relates to a technology for processing exhaust gas discharged from a process chamber of a semiconductor manufacturing facility using plasma, and more particularly, to a plasma reactor for processing exhaust gas discharged from a process chamber of a semiconductor manufacturing facility using inductively coupled plasma and a method of assembling the same.

Background Art

Semiconductor devices are manufactured by repeatedly performing processes such as photolithography, etching, diffusion, and metal deposition on a wafer in a process chamber. During a semiconductor manufacturing process, various process gases are used, and after the process is completed, a residual gas in the process chamber contains various harmful components such as PFCs. The residual gas in the process chamber is discharged through an exhaust line by a vacuum pump after the process is completed, and the exhaust gas is purified by an exhaust gas processing device so that harmful components are not discharged as they are.

Recently, a technique of decomposing and processing harmful components using a plasma reaction has been widely used. As a prior art related to the present invention, Korean Patent Laid-open Publication No. 2019-19651 discloses a plasma chamber for processing exhaust gas using inductively coupled plasma. In inductively coupled plasma, when radio frequency power is applied to the antenna coil, a magnetic field is induced by a time-varying current flowing through the antenna coil, thereby generating plasma by an electric field generated inside the chamber. In general, a plasma reactor for inductively coupled plasma includes a chamber providing a space for generating plasma, a ferrite core coupled to surround the chamber, an antenna coil wound around the ferrite core, and an igniter for initial plasma ignition.

SUMMARY

Technical Problem

The present invention provides an inductively coupled plasma reactor and a method of assembling the same.

Technical Solution

According to an aspect of the present invention, there is provided a plasma reactor for inductively coupled plasma including a ferrite core assembly including a ferrite core stacked body including a plurality of ferrite cores stacked and a first passage portion and a second passage portion arranged in parallel, and a ferrite core accommodating structure configured to accommodate the ferrite core stacked body, a first chamber body including a first base portion configured to provide a first internal space therein, a first A-extension pipe extending from the first base portion, communicating with the first internal space and accommodated in the first passage portion, and a second A-extension pipe extending from the first base portion, communicating with the first internal space and accommodated in the second passage portion, and a second chamber body including a second base portion configured to provide a second internal space therein, a first B-extension pipe extending from the second base portion, communicating with the second internal space and accommodated in the first passage portion to be connected to the first A-extension pipe, and a second B-extension pipe extending from the second base portion, communicating with the second internal space and accommodated in the second passage portion to be connected to the second A-extension pipe.

According to another aspect of the present invention, there is provided a method of assembling a plasma reactor for inductively coupled plasma, the method including preparing a ferrite core assembly including a ferrite core stacked body including a plurality of ferrite cores stacked and a first passage portion and a second passage portion arranged in parallel, and a ferrite core accommodating structure configured to accommodate the ferrite core stacked body, preparing a first chamber body including a first base portion configured to provide a first internal space therein, and a first A-extension pipe and a second A-extension pipe extending from the first base portion and communicating with the first internal space, preparing a second chamber body including a second base portion configured to provide a second internal space therein, and a first B-extension pipe and a second B-extension pipe extending from the second base portion and communicating with the second internal space, pre-assembling, wherein the first A-extension pipe and the first B-extension pipe are inserted to face each other and connected through the first passage portion and the second A-extension pipe and the second B-extension pipe are inserted to face each other and connected through the second passage portion, and coupling the first chamber body and the second chamber body.

Effects of the Invention

According to the present invention, all the objectives of the present invention described above can be achieved. Specifically, a ferrite core stacked body formed by accommodating a plurality of stacked ferrite cores in a ferrite core accommodating structure is provided, and because a first chamber body and a second chamber body are screwed to each other by a plurality of coupling rods, a plasma reactor for inductively coupled plasma is structurally robust and can be conveniently assembled and manufactured with improved workability.

DETAILED DESCRIPTION

Hereinafter, the configuration and operation of an embodiment of the present invention will be described in detail with reference to the drawings.

Figure 1:
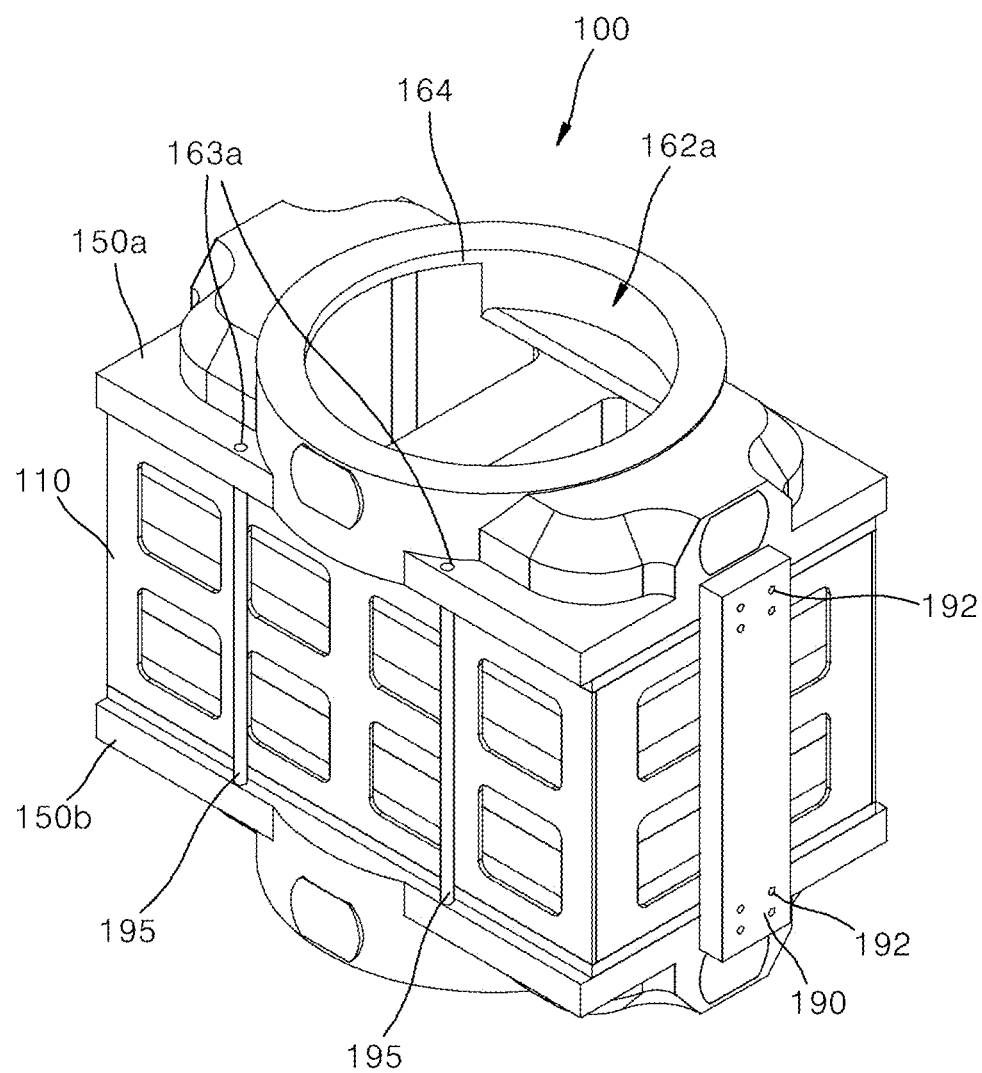
FIG. 1 is a perspective view illustrating a plasma reactor for inductively coupled plasma according to an embodiment of the present invention.
Figure 2:
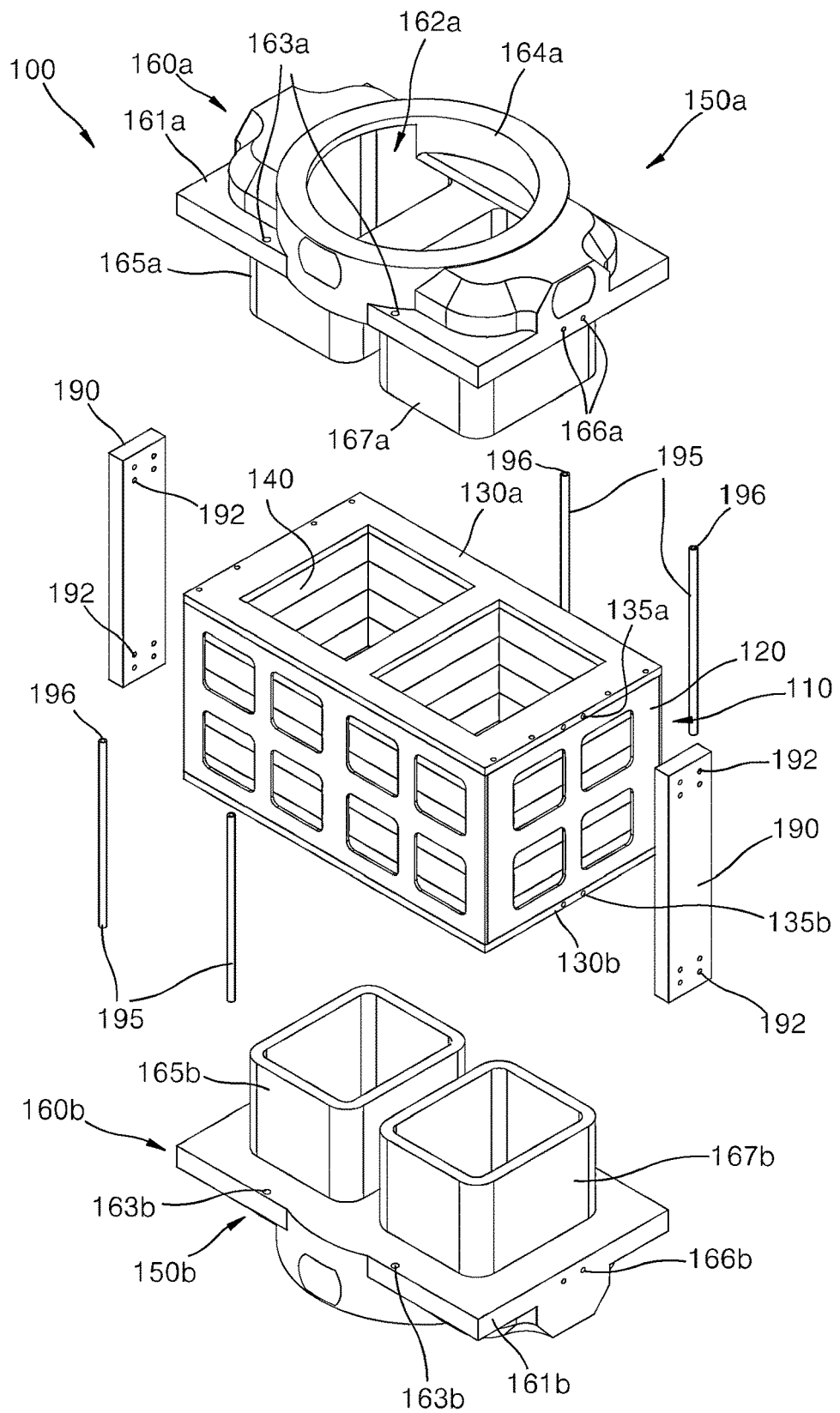
FIG. 2 is an exploded perspective view of the plasma reactor for inductively coupled plasma shown in FIG. 1.

A plasma reactor for inductively coupled plasma according to an embodiment of the present invention is shown in a perspective view in FIG. 1 and in an exploded perspective view in FIG. 2. Referring to FIGS. 1 and 2, a plasma reactor 100 for inductively coupled plasma according to an embodiment of the present invention includes a ferrite core assembly 110, a first chamber unit 150a partially passing through the ferrite core assembly 110, a second chamber unit 150b partially passing through the ferrite core assembly 110 and connected to the first chamber unit 150a, and a plurality of coupling rod members 190 and 195 connected between the two chamber units 150a and 150b to couple the two chamber units 150a and 150b. In the present embodiment, the plasma reactor 100 for inductively coupled plasma is installed in an exhaust pipe that discharges residual gas generated from a process chamber in a semiconductor manufacturing facility to process exhaust gas flowing along the exhaust pipe using inductively coupled plasma. The present invention does not limit the use and installation location of the plasma reactor 100 for inductively coupled plasma as described above. The plasma reactor 100 for inductively coupled plasma is operated by receiving appropriate power from a power source (not shown).

Figure 3:
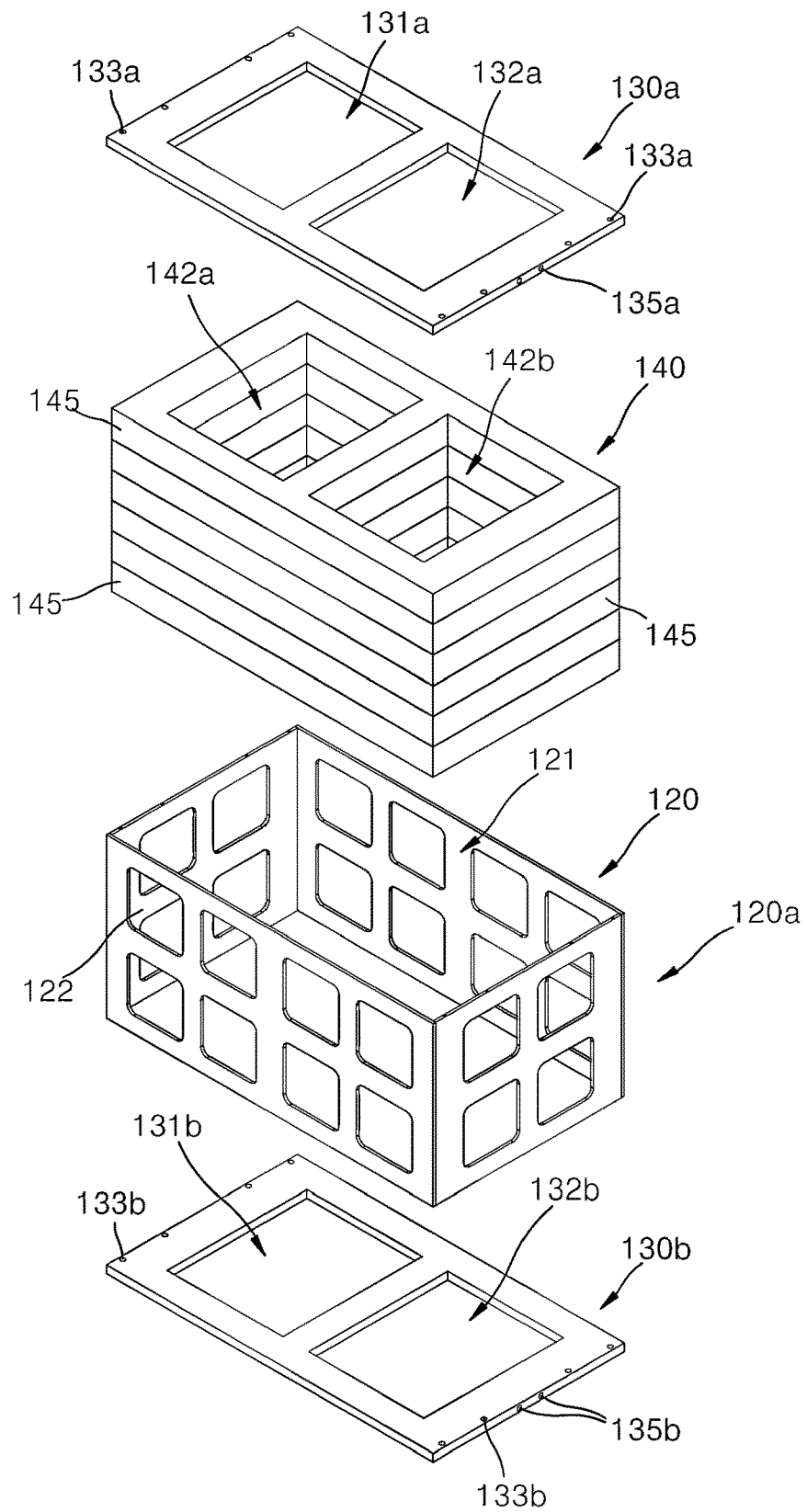
FIG. 3 is an exploded perspective view of a ferrite core assembly in the plasma reactor for inductively coupled plasma shown in FIG. 2.

FIG. 3 shows the ferrite core assembly 110 in an exploded perspective view. Referring to FIGS. 1, 2 and 3, the ferrite core assembly 110 includes a ferrite core stacked body 140 and a ferrite core accommodating structure 120a accommodating the ferrite core stacked body 140.

The ferrite core stacked body 140 is formed by sequentially stacking a plurality of ferrite cores 145 having the same shape and includes a first passage portion 142a and a second passage portion 142b, which are arranged in parallel on the ferrite core stacked body 140 and extend in parallel along a vertical direction in the drawing. The first passage portion 142a and the second passage portion 142b penetrate through the ferrite core stacked body 140 so that both ends of the upper and lower portions thereof are opened, and the side surfaces thereof are blocked. The ferrite core stacked body 140 is accommodated in the ferrite core accommodating structure 120a.

Figure 4:
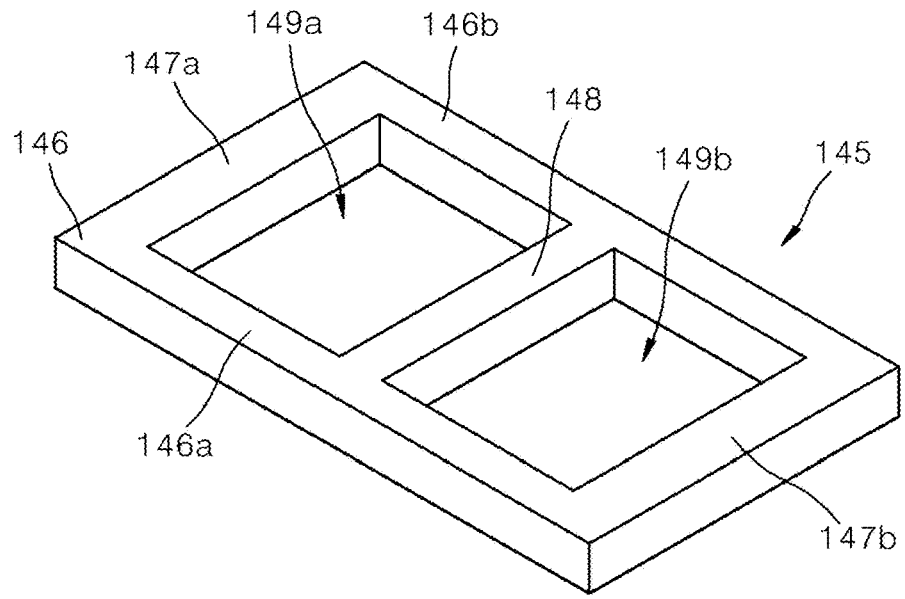
FIG. 4 is a perspective view illustrating a ferrite core in the ferrite core assembly shown in FIG. 3.

In FIG. 4, the ferrite core 145 is shown in a perspective view. Referring to FIGS. 3 and 4, a plurality of ferrite cores 145 are stacked to form a ferrite core stacked body 140. In the present embodiment, the ferrite core 145 will be described as being a ferrite core commonly used in an inductively coupled plasma device. The ferrite core 145 includes an annular portion 146 and a connection portion 148 crossing the inner region of the annular portion 146.

The annular portion 146 has a rectangular annular shape, and includes opposing first and second long side portions 146a and 146b and opposing first and second short side portions 147a and 147b. Each of the first short side portion 147a and the second short side portion 147b connects opposite ends of the first long side portion 146a and the second long side portion 146b in a lengthwise direction so that the first long side portion 146a, the first short side portion 147a, the second long side portion 146b and the second short side portion 147b are continuously connected along the circumferential direction of the annular portion 146.

The connection portion 148 extends in a straight line to connect the two opposite long side portions 146a and 146b of the annular portion 146. Both ends of the connection portion 148 are connected to the longitudinal center portion of each of the two long side portions 146a and 146b. The inner region of the annular portion 146 is separated into a first through hole 149a and a second through hole 149b having a square shape by the connection portion 148, respectively. In the ferrite core stacked body 140 formed by stacking a plurality of ferrite cores 145, the first through holes 149a of each of the plurality of ferrite cores 145 are connected to the first ferrite core stacked body 140 to form a first passage portion 142a of the ferrite core stacked body 140, and second through holes 149b of each of the plurality of ferrite cores 145 are connected to form a second passage portion 142b of the ferrite core stacked body 140.

The ferrite core accommodating structure 120a provides an accommodation space 121 for accommodating the ferrite core stacked body 140 therein. The material of the ferrite core accommodating structure 120a is made of an electrical insulator. The ferrite core accommodating structure 120a includes a sidewall member 120 having both ends open, and a first finishing member 130a and a second finishing member 130b coupled to both open ends of the sidewall member 120, respectively. The accommodation space 121 provided by the ferrite core accommodating structure 120a is formed in a shape and size corresponding to the outer shape of the ferrite core stacked body 140 to be accommodated, so that, when the ferrite core stacked body 140 is accommodated in the accommodation space 121 of the ferrite core accommodating structure 120a, the ferrite core stacked body 140 does not shake within the accommodation space 121 and maintains its shape steadily.

The side wall member 120 is an overall rectangular wall structure, and the upper and lower ends, which are both ends, are open in the drawing. The sidewall member 120 forms an accommodation space 121 therein, and surrounds side surfaces of the ferrite core stacked body 140 in a state in which the ferrite core stacked body 140 is accommodated in the accommodation space 121. The side wall member 120 has a plurality of windows 122 through which the accommodation space 121 and the outside communicate with each other, and a region corresponding to the side of the ferrite core stacked body 140 accommodated in the accommodation space 121 through the plurality of windows 122 is exposed to the outside. The first finishing member 130a is coupled to the open upper end of the sidewall member 120, and the second finishing member 130b is coupled to the open lower end of the sidewall member 120.

The first finishing member 130a is coupled to the open upper end of the side wall member 120 through a fastening unit such as screwing. The first finishing member 130a has substantially the same shape as the ferrite core 145, and the first finishing member 130a has a first A-opening 131a communicating with the first passage portion 142a of the ferrite core stacked body 140 and a second A-opening 132a communicating with the second passage portion 132a of the ferrite core stacked body 140. A plurality of screw holes 133a for screwing with the side wall member 120 are formed in the first finishing member 130a. In addition, a plurality of screw holes 135a for screwing with the coupling rods 190 are formed on the side of the first finishing member 130a. The first finishing member 130a is in close contact with the uppermost ferrite core 145 of the ferrite core stacked body 140 in a state in which the ferrite core stacked body 140 is accommodated in the accommodation space 121.

The second finishing member 130b is coupled to the open lower end of the sidewall member 120 through a fastening unit such as screwing. The second finishing member 130b has substantially the same shape as the ferrite core 145, and the second finishing member 130b has a first B-opening portion 131b communicating with the first passage portion 142a of the ferrite core stacked body 140 and a second B-opening portion 132b communicating with the second passage portion 132a of the ferrite core stacked body 140. A plurality of screw holes 133b for screwing with the side wall member 120 are formed in the second finishing member 130b. In addition, a plurality of screw holes 135b for screwing with the coupling rods 190 are formed on the side of the second finishing member 133b. The second finishing member 130b is in close contact with the lowermost ferrite core 145 of the ferrite core stacked body 140 in a state in which the ferrite core stacked body 140 is accommodated in the accommodation space 121.

A plurality of ferrite cores 145 are accommodated in the accommodation space 121 through the open upper end of the side wall member 120 and stacked after the second finishing member 130b is coupled to the side wall member 120, and the first finishing member 130a is coupled to the open upper end of the sidewall member 120 so that the ferrite core assembly 110 may be completed.

Referring to FIGS. 1 and 2, a first chamber unit 150a includes a first chamber body 160a and a plurality of first igniters (not shown) installed in the first chamber body 160a. The first chamber unit 150a is structurally coupled to the second chamber unit 150b by a plurality of coupling rods 190 and 195.

The first chamber body 160a includes a first base portion 161a, and a first A-extension pipe 165a and a second A-extension pipe 167a extending from the first base portion 161a.

The first base portion 161a provides a first internal space 162a therein, and a gas inlet 164a which communicates with the first internal space 162a and through which gas to be processed is introduced, is formed in the first base portion 161a. The first internal space 162a communicates with the first A-extension pipe 165a and the second A-extension pipe 167a. The first base portion 161a is in close contact with the first finishing member 130a of the ferrite core assembly 110. Each of a plurality of first igniters (not shown) is inserted and installed in the first base portion 161a. A plurality of first screw coupling holes 166a through which the plurality of coupling rods 190 are screwed to each other, are formed on side surfaces of the first base portion 161a. In addition, a plurality of first screw through holes 163a through which the plurality of coupling rods 195 are screwed to each other, are formed on the first base portion 161a.

The first A-extension pipe 165a and the second A-extension pipe 167a are formed to extend parallel to each other from the first base portion 161a. The first A-extension pipe 165a and the second A-extension pipe 167a communicate with the first internal space 162a of the first base portion 161a, and the end of the first A-extension pipe 165a and the end of the second A-extension pipe 167a are open. The first A-extension pipe 165a is accommodated in the first passage portion 142a of the ferrite core assembly 110, and the second A-extension pipe 167a is accommodated in the second passage portion 142b of the ferrite core assembly 110. The open end of the first A-extension pipe 165a and the open end of the second A-extension pipe 167a are connected to the second chamber unit 150b. The first chamber body 160a and the second chamber body 160b are connected to form a toroidal-shaped chamber.

Each of the plurality of first igniters (not shown) is installed at an appropriate position of the first base portion 161a of the first chamber body 160a.

The second chamber unit 150b includes a second chamber body 160b and a plurality of second igniters (not shown) installed in the second chamber body 160b. The second chamber unit 150b is structurally coupled to the first chamber unit 150a by a plurality of coupling rods 190 and 195.

The second chamber body 160b has substantially the same structure as the first chamber body 160a, and includes a second base portion 161b, a first B-extension pipe 165b and a second B-extension pipe 167b extending from the second base portion 161b.

The second base portion 161b provides a second internal space (not shown) therein, and a gas outlet (not shown) which communicates with the second internal space (not shown) and through which the processed gas is discharged to the outside, is formed in the second base portion 161b. The second internal space (not shown) communicates with the second A-extension pipe 165b and the second B-extension pipe 167b. The second base portion 161b is in close contact with the second finishing member 130b of the ferrite core assembly 110. Each of a plurality of second igniters (not shown) is inserted and installed in the second base portion 161b. A plurality of second screw coupling holes 166b through which the plurality of coupling rods 190 are screwed to each other, are formed on side surfaces of the second base portion 161b. In addition, a plurality of second screw through holes 163b through which the plurality of coupling rods 195 are screwed to each other, are formed on the second bae portion 161b.

The first B-extension pipe 165b and the second B-extension pipe 167b are formed to extend parallel to each other from the second base portion 161b. The first B-extension pipe 165b and the second B-extension pipe 167b communicate with the second internal space (not shown) of the first base portion 161b, and the end of the first B-extension pipe 165b and the end of the second B-extension pipe 167b are open. The first B-extension pipe 165b is accommodated in the first passage portion 142a of the ferrite core assembly 110, and the second B-extension pipe 167b is accommodated in the second passage portion 142b of the ferrite core assembly 110. The first B-extension pipe 165b is connected to and communicates with the first A-extension pipe 165a, and the second B-extension pipe 167b is connected to and communicates with the second A-extension pipe 167a, and although not shown, a DC breaker (not shown) is positioned between the end of the first A-extension pipe 165a and the end of the first B-extension pipe 165b and between the end of the second A-extension pipe 167a and the end of the second B-extension pipe 167b.

Each of the plurality of second igniters (not shown) is installed at an appropriate position of the second base portion 161b of the second chamber body 160b.

The plurality of coupling rod members 190 and 195 are connected between the first chamber unit 150a and the second chamber unit 150b to couple the two chamber units 150a and 150b.

The plurality of coupling rod members 190 and 195 include a plurality of first coupling rod members 190 and a plurality of second coupling rod members 195.

The plurality of first coupling rod members 190 have a generally rectangular rod shape, and one side of both ends thereof is screwed to a side surface of the first base portion 161*a* of the first chamber body 160*a*, a side surface of the first finishing member 130*a* of the ferrite core assembly 140, a side surface of the second base portion 161*b* of the second chamber body 160*b*, and a side surface of the second finishing member 130*b* of the ferrite core assembly 140. To this end, a plurality of screw through holes 192 are formed on the side surfaces of the first coupling rod member 190. That is, the first coupling rod member 190 includes a first screw coupling hole 166*a* formed on the first base portion 161*a*, a second screw coupling hole 166*b* formed on the second base portion 161*b*, a first screw hole 135*a* formed in the first finishing member 130*a*, and a second screw hole 135*b* formed in the second finishing member 130*b*. To this end, female screws are formed in the first and second screw coupling holes 166*a* and 166*b* and the first and second screw holes 135*a* and 135*b*.

The plurality of second coupling rod members 190 have a generally circular rod shape, and are screwed to each other while being inserted between the first base portion 161*a* and the second base portion 161*b*. Female screw holes 196 are formed at both ends of the second coupling rod members 190. Male screws to be inserted into the first screw hole 163*a* formed in the first base portion 161*a* and the second screw hole 163*b* formed in the second base portion 161*b* are coupled to the female screw holes 196 of the second coupling rod members 190.

Figure 5:
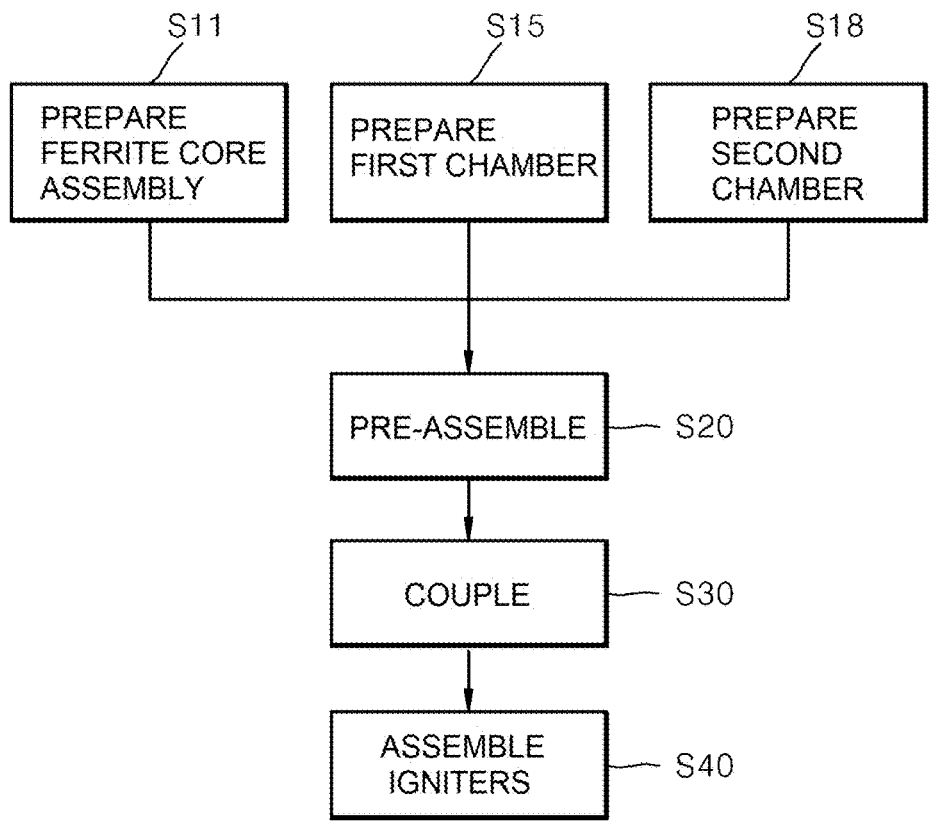
FIG. 5 is a flowchart schematically illustrating a method of assembling the plasma reactor for inductively coupled plasma shown in FIG. 1, according to an embodiment of the present invention.

FIG. 5 is a flowchart illustrating a method of assembling the plasma reactor for inductively coupled plasma shown in FIG. 1, according to an embodiment. Referring to FIG. 5, the method of assembling the plasma reactor for inductively coupled plasma according to an embodiment of the present invention includes preparing a ferrite core assembly (S11), preparing a first chamber (S15), preparing a second chamber (S18), pre-assembling (S20), coupling (S30), and assembling igniters (S40). The method of assembling the plasma reactor for inductively coupled plasma shown in FIG. 5 is a method of assembling the plasma reactor for inductively coupled plasma shown in FIG. 1, and thus will be described with reference to FIGS. 1 to 4.

In the preparing of the ferrite core assembly (S11), the ferrite core assembly 110 having the configuration shown in FIG. 2 is prepared. Referring to FIG. 3, the ferrite core assembly 110 having the configuration shown in FIG. 2 may be completed when a plurality of ferrite cores 145 are accommodated in the accommodation space 121 through the open upper end of the sidewall member 120 and stacked after the second finishing member 130 is coupled to the sidewall member 120 and the first finishing member 130*a* is coupled to the open upper end of the sidewall member 120.

In the preparing of the first chamber (S15), the first chamber body 160*a* having the configuration shown in FIG. 2 is prepared.

In the preparing of the second chamber (S18), the second chamber body 160*b* having the configuration shown in FIG. 2 is prepared.

In the pre-assembling (S20), the ferrite core assembly 110 prepared through the preparing of the ferrite core assembly (S11), the first chamber body 160*a* prepared through the preparing of the first chamber (S15), and the second chamber body 160*b* prepared through the preparing of the second chamber (S18) are pre-assembled.

Specifically, in the pre-assembling (S20), the first-A extension pipe 165*a* of the first chamber body 160*a* and the first B-extension pipe 165*a* of the second chamber body 160*b* are inserted to face each other and connected through the first passage portion 142*a* of the ferrite core assembly 110, and the second A-extension pipe 167*a* of the first chamber body 160*a* and the second B-extension pipe 167*b* of the second chamber body 160*b* are inserted to face each other and connected through the second passage portion 142*b* of the ferrite core assembly 110.

In the coupling (S30), the ferrite core assembly 1100, the first chamber body 160*a*, and the second chamber body 160*b* pre-assembled through the pre-assembling (S20) are screwed to each other using a plurality of combining rods 190 and 195.

In the assembling of igniters (S40), a plurality of first igniters (not shown) are installed on the first chamber body 160*a*, and a plurality of second igniters (not shown) are installed on the second chamber body 160*b*.

While the present invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. A plasma reactor for inductively coupled plasma comprising:
    a ferrite core assembly comprising a ferrite core stacked body including a plurality of ferrite cores stacked and a first passage portion and a second passage portion arranged in parallel, and a ferrite core accommodating structure configured to accommodate the ferrite core stacked body;
    a first chamber body comprising a first A-extension pipe accommodated in the first passage portion, and a second A-extension pipe accommodated in the second passage portion; and
    a second chamber body comprising a first B-extension pipe accommodated in the first passage portion to be connected to the first A-extension pipe, and a second B-extension pipe accommodated in the second passage portion to be connected to the second A-extension pipe.

2. The plasma reactor of claim 1, further comprising a plurality of coupling rods configured to couple the first chamber body and the second chamber body.

3. The plasma reactor of claim 2, wherein the plurality of coupling rods are screwed to the first chamber body and the second chamber body.

4. The plasma reactor of claim 2, wherein a part of the plurality of coupling rods comprises a plurality of first coupling rods that are also coupled to the ferrite core accommodating structure.

5. The plasma reactor of claim 1, further comprising a DC breaker positioned between an end of the first A-extension pipe and an end of the first B-extension pipe and between an end of the second A-extension pipe and an end of the second B-extension pipe, respectively.

6. The plasma reactor of claim 1, wherein the ferrite core accommodation structure comprises a sidewall member surrounding side surfaces of the ferrite core stacked body and having upper and lower ends open, a first finishing member coupled to the upper end of the sidewall member, and a second finishing member coupled to the lower end of the sidewall member, the first finishing member has a first A-opening corresponding to the first passage portion and a second A-opening corresponding to the second passage portion, and the second finishing member has a first B-opening corresponding to the first passage portion and a second B-opening corresponding to the second passage portion.

7. A method of assembling a plasma reactor for inductively coupled plasma, the method comprising:
  preparing a ferrite core assembly comprising a ferrite core stacked body including a plurality of ferrite cores stacked and a first passage portion and a second passage portion arranged in parallel, and a ferrite core accommodating structure configured to accommodate the ferrite core stacked body;
  preparing a first chamber body comprising a first A-extension pipe and a second A-extension pipe extending in parallel;
  preparing a second chamber body comprising a first B-extension pipe and a second B-extension pipe extending in parallel;
  pre-assembling, wherein the first A-extension pipe and the first B-extension pipe are inserted to face each other and connected through the first passage portion and the second A-extension pipe and the second B-extension pipe are inserted to face each other and connected through the second passage portion; and
  coupling the first chamber body and the second chamber body.

8. The method of claim 7, wherein, in the coupling, the first chamber body and the second chamber body are coupled to each other using a plurality of coupling rods.

9. The method of claim 8, wherein, in the coupling, the plurality of coupling rods are screwed to the first chamber body and the second chamber body.

10. The method of claim 7, further comprising assembling igniters to couple the igniters to the first chamber body or the second chamber body.

* * * * *